(12) United States Patent
Tsuchiya et al.

(10) Patent No.: US 8,604,608 B2
(45) Date of Patent: Dec. 10, 2013

(54) SEMICONDUCTOR MODULE

(75) Inventors: Jiro Tsuchiya, Susono (JP); Torahiko Sasaki, Mishima (JP); Makoto Imai, Toyota (JP); Hideki Tojima, Numazu (JP); Tadakazu Harada, Susono (JP); Tomoaki Mitsunaga, Susono (JP)

(73) Assignee: Toyota Jidosha Kabushiki Kaisha, Toyota (JP)

( * ) Notice: Subject to any disclaimer, the term of this patent is extended or adjusted under 35 U.S.C. 154(b) by 0 days.

(21) Appl. No.: 13/448,915

(22) Filed: Apr. 17, 2012

(65) Prior Publication Data

US 2013/0009168 A1   Jan. 10, 2013

(30) Foreign Application Priority Data

Jul. 4, 2011   (JP) .................................. 2011-148040

(51) Int. Cl.
   *H01L 23/34*   (2006.01)
   *H01L 23/10*   (2006.01)
   *H05K 7/20*   (2006.01)

(52) U.S. Cl.
   USPC ........... 257/714; 257/713; 257/706; 257/707; 257/723; 257/724; 257/E23.097; 361/704

(58) Field of Classification Search
   USPC .................................. 257/714–722
   See application file for complete search history.

(56) References Cited

U.S. PATENT DOCUMENTS

| | | | | |
|---|---|---|---|---|
| 2006/0055027 A1* | 3/2006 | Kitabatake et al. | ........... | 257/706 |
| 2010/0176313 A1* | 7/2010 | Melnychuk et al. | ...... | 250/504 R |
| 2010/0259898 A1* | 10/2010 | Kimura et al. | ................ | 361/704 |

FOREIGN PATENT DOCUMENTS

| | | |
|---|---|---|
| JP | A-2002-34268 | 1/2002 |
| JP | A-2004-289955 | 10/2004 |
| JP | A-2006-303455 | 11/2006 |
| JP | A-2009-60691 | 3/2009 |
| JP | A-2010-153527 | 7/2010 |
| JP | A-2011-103756 | 5/2011 |
| JP | A-2011-115020 | 6/2011 |
| WO | WO 01/31771 A1 | 5/2001 |

* cited by examiner

*Primary Examiner* — Matthew W Such
*Assistant Examiner* — Frederick B Hargrove
(74) *Attorney, Agent, or Firm* — Oliff & Berridge, PLC

(57) ABSTRACT

A semiconductor module is disclosed that includes a semiconductor element, a capacitor configured to be electrically connected to the semiconductor element and a heat sink, wherein the semiconductor and the capacitor are stacked with each other via the heat sink, and wherein the semiconductor element is disposed in a position overlapping with the capacitor as viewed from a stack direction.

5 Claims, 12 Drawing Sheets

SEMICONDUCTOR MODULE

BACKGROUND OF THE INVENTION

1. Field of the Invention

The present invention relates to a semiconductor module including a semiconductor element.

2. Description of the Related Art

Conventionally, there has been known a semiconductor module including a semiconductor element such as a switching element and a capacitor. For example, one of the semiconductor modules includes a cooling line, a positive terminal, a negative terminal, a positive side heat sink, a negative side heat sink, a semiconductor and a capacitor. In this semiconductor module, direct current is supplied to the positive terminal and the negative terminal, the semiconductor element is connected to the positive side heat sink and the negative side heat sink, and the capacitor is electrically connected in parallel with the semiconductor element between the positive side heat sink and the negative side heat sink. When the semiconductor is being turned on, the positive side heat sink and the negative side heat sink radiate heat generated by the semiconductor element, and the cooling line cools the positive side heat sink, the negative side heat sink and the capacitor (see, e.g., Patent Document 1).

[Patent Document 1] Japanese Patent Application Publication No. 2010-153527

Since the capacitor and the semiconductor element are connected via the positive side heat sink and the negative side heat sink according to the semiconductor module as described above, the heat radiated from the semiconductor element conducts to the capacitor. Thus, there is a problem in that it is difficult to operate the semiconductor element at high temperature.

For example, upper temperature limit of the capacitor is about 105° C. in a case where the capacitor included in the semiconductor module is a film capacitor. On the contrary, upper temperature limit of the semiconductor element included in the semiconductor module is about 150° C. in a case where the main component of the semiconductor element is silicon (Si). Alternatively, upper temperature limit of the semiconductor element included in the semiconductor module is about 250° C. in a case where the main component of the semiconductor element is silicon carbide (SiC). Accordingly, it is difficult to operate the semiconductor element in a condition where the environmental temperature becomes higher than 105° C. which is the upper temperature limit of the capacitor.

SUMMARY OF THE INVENTION

It is an object of the present invention to provide a semiconductor module which includes a capacitor and can operate at high temperature.

Features and advantages of the present invention will be set forth in the description which follows, and in part will become apparent from the description and the accompanying drawings, or may be learned by practice of the invention according to the teachings provided in the description. Objects as well as other features and advantages of the present invention will be realized and attained by a semiconductor module particularly pointed out in the specification in such full, clear, concise, and exact terms as to enable a person having ordinary skill in the art to practice the invention.

To achieve these and other advantages and in accordance with the purpose of the invention, as embodied and broadly described herein, an embodiment of the present invention provides a semiconductor module including a semiconductor element, a capacitor configured to be electrically connected to the semiconductor element and a heat sink, wherein the semiconductor and the capacitor are stacked with each other via the heat sink, and wherein the semiconductor element is disposed in a position overlapping with the capacitor as viewed from a stack direction.

Other objects, features and advantages of the embodiments of the present invention will become more apparent from the following detailed description when read in conjunction with the accompanying drawings.

DESCRIPTION OF THE PREFERRED EMBODIMENTS

A description is given, with reference to the accompanying drawings, of embodiments of a semiconductor module.

First Embodiment

Figure 1:
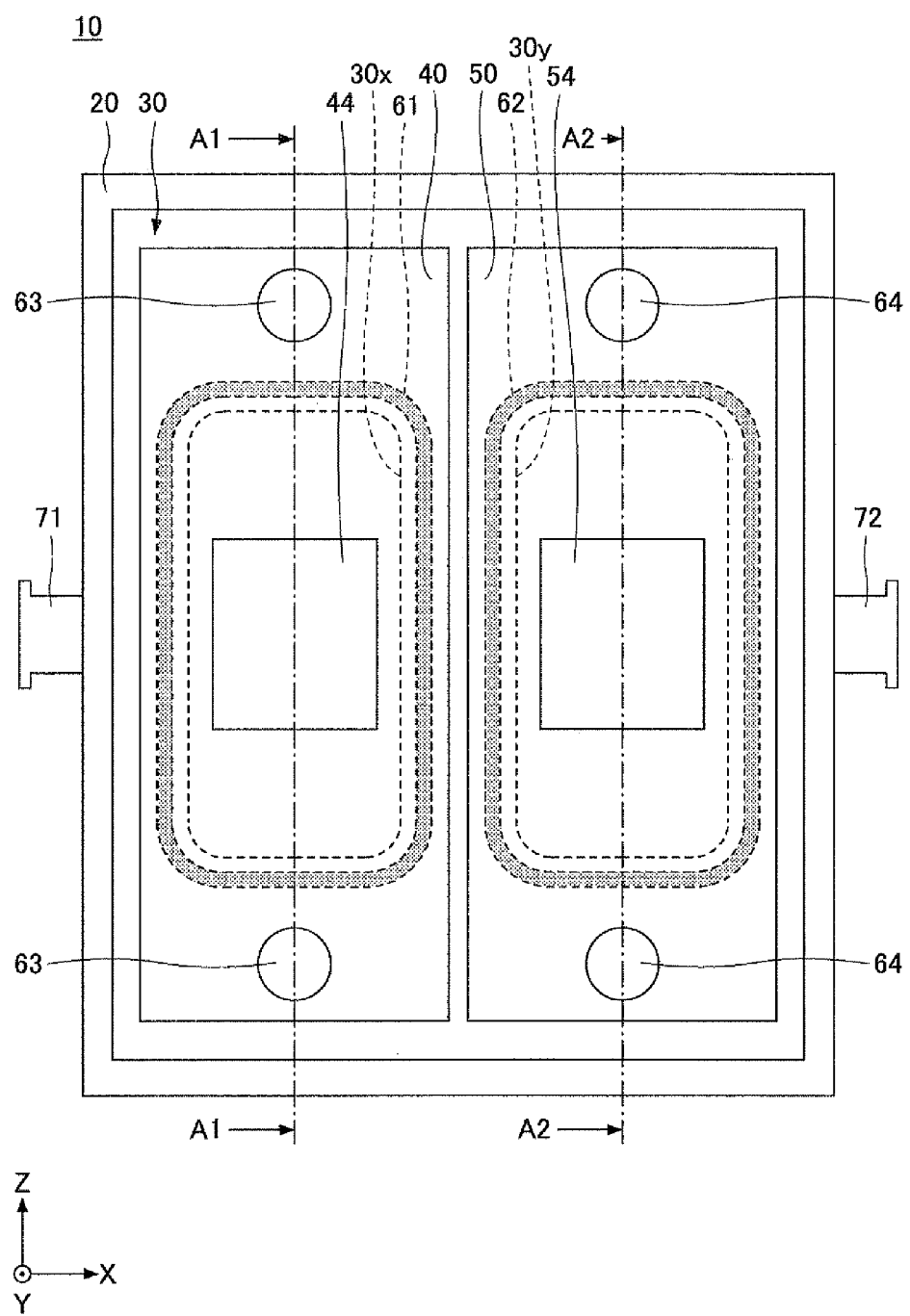
FIG. 1 is a front view illustrating an example of a semiconductor module according to a first embodiment.
Figure 2:
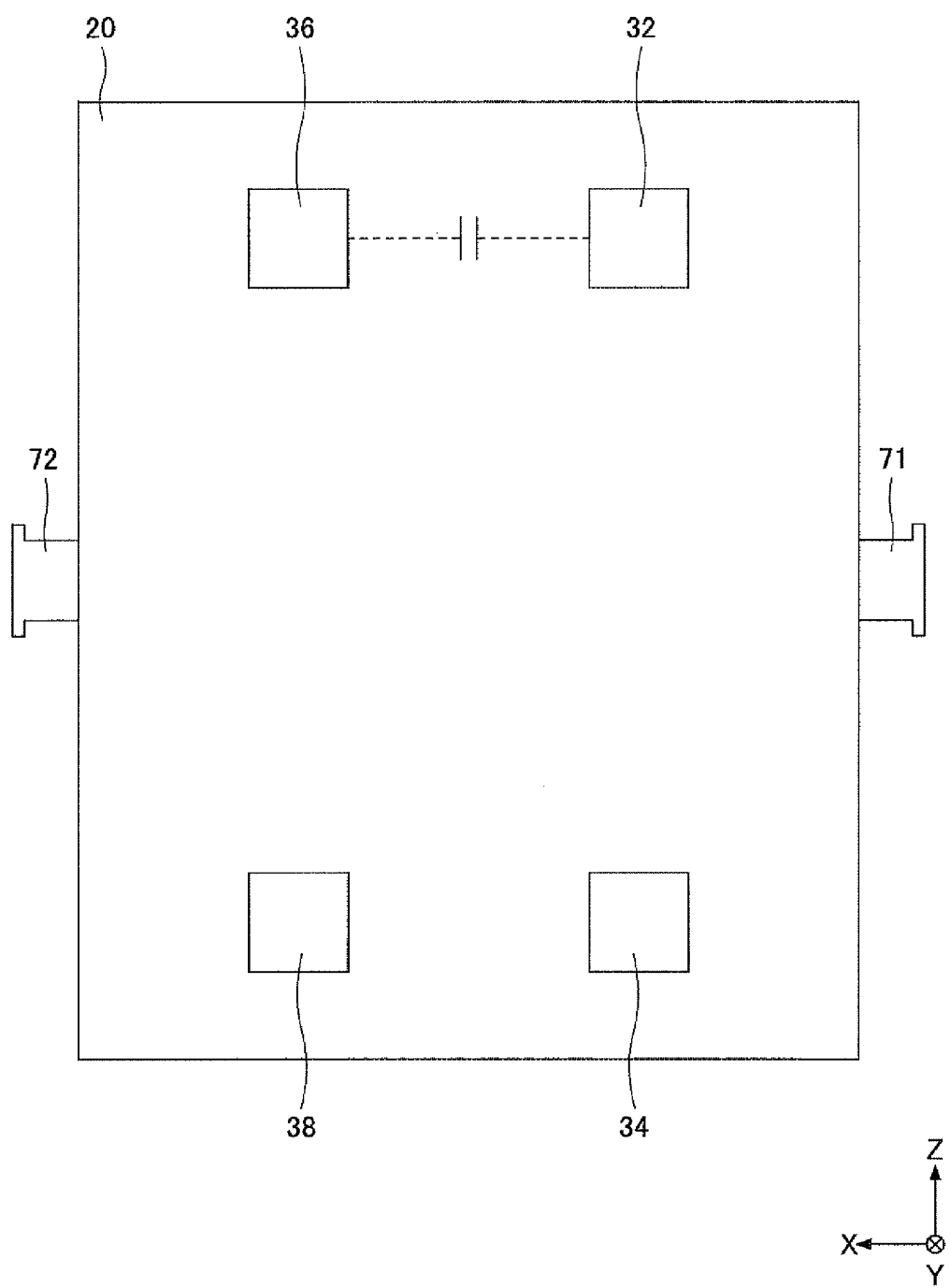
FIG. 2 is a back view illustrating an example of the semiconductor module according to the first embodiment.
Figure 3:
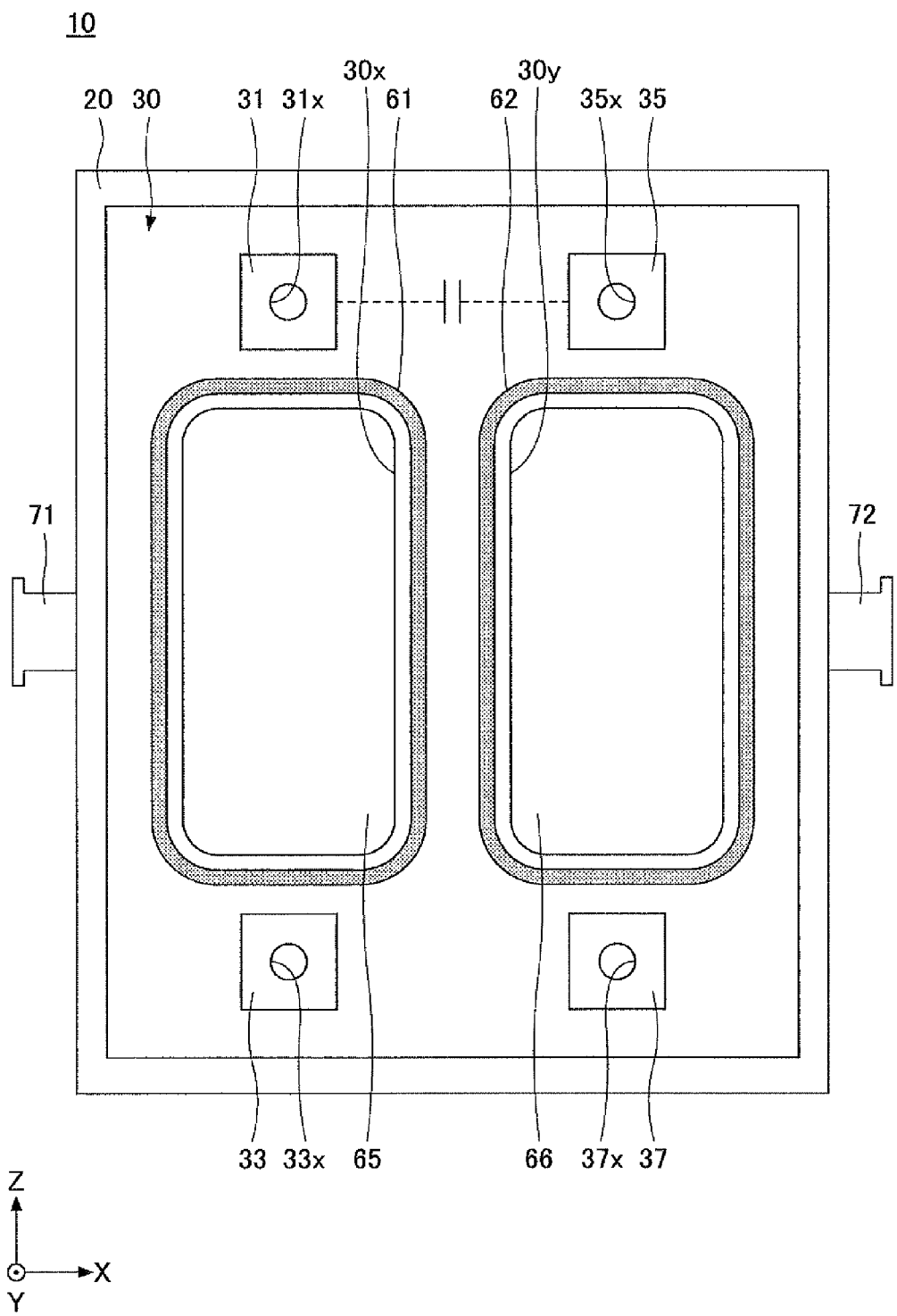
FIG. 3 is a front view illustrating an example of a portion of the semiconductor module according to the first embodiment.
Figure 4:
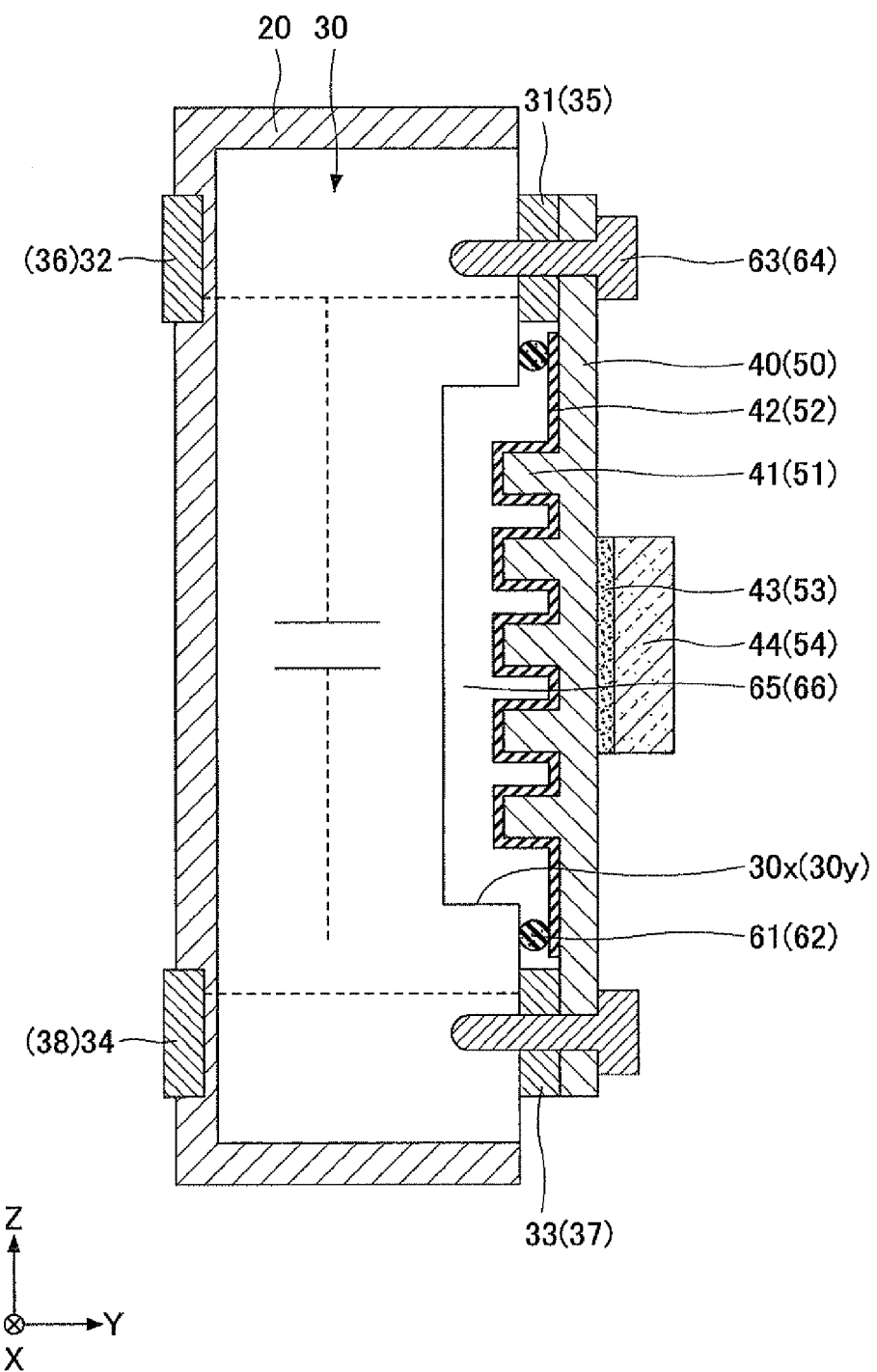
FIG. 4 is a cross-sectional view of the semiconductor module taken along a line A1-A1 illustrated in FIG. 1.

FIG. 1 is a front view illustrating an example of a semiconductor module according to the first embodiment. FIG. 2 is a back view illustrating an example of the semiconductor module according to the first embodiment. FIG. 3 is a front view illustrating an example of a portion of the semiconductor module according to the first embodiment. FIG. 4 is a cross-sectional view of the semiconductor module taken along a line A1-A1 illustrated in FIG. 1. Herein, in FIG. 3, bus bars 40 and 50, semiconductor elements 44 and 54, and fixing members 63 and 64 that will be described hereinafter are omitted. Since a cross-sectional view of the semiconductor module taken along a line A2-A2 illustrated in FIG. 1 is similar to the cross-sectional view of the semiconductor module taken along a line A1-A1 illustrated in FIG. 1, reference numerals in parentheses in FIG. 4 indicate configuration in the cross section along line A2-A2.

As illustrated in FIGS. 1 to 4, the semiconductor module 10 includes a body 20, a capacitor 30, the bus bars 40 and 50, and the semiconductor elements 44 and 54 as main configuration elements. Herein, the bus bars 40 and 50 are metal members that are used as power supply lines, respectively.

The capacitor 30 is formed on the body 20. Although the capacitor 30 is illustrated in a simplified manner, the capacitor 30 may be a film capacitor or an electrolytic capacitor which is sealed by molded resin or the like, for example. The body 20 may be made of metal such as aluminum (Al), iron (Fe) or the like, or resin, for example. The capacitor 30 may be formed in almost an entire portion of the body 20. The body 20 and the capacitor 30 are electrically insulated with each other.

The capacitor 30 includes terminals 31 to 38 that are made of copper (Cu), aluminum (Al) or the like. The terminals 31 to 38 are electrically insulated from the body 20, respectively. The terminals 31 and 32 are disposed in almost opposed areas with regard to the capacitor 30. The terminals 33 and 34 are disposed in almost opposed areas with regard to the capacitor 30. The terminals 35 and 36 are disposed in almost opposed areas with regard to the capacitor 30. The terminals 37 and 38 are disposed in almost opposed areas with regard to the capacitor 30.

The terminals 31 and 33 are electrically connected via the bus bar 40. The terminals 35 and 37 are electrically connected via the bus bar 50. The terminals 31 and 33 are connected to one electrode (not illustrated) of the capacitor 30, and the terminals 35 and 37 are electrically connected to the other electrode (not illustrated) of the capacitor 30.

The terminals 31 and 32 are electrically connected. The terminal 32 may be used as an external connection terminal. The terminals 33 and 34 are electrically connected. The terminal 34 may be used as an external connection terminal. Herein, since the terminals 32 and 34 are subjected to the same electrical potential, any one of the terminals 32 and 34 may be used as the external connection terminal. Alternatively, a portion of the bus bar 40 may be used as the external connection terminal.

The terminals 35 and 36 are electrically connected. The terminal 36 may be used as an external connection terminal. The terminals 37 and 38 are electrically connected. The terminal 38 may be used as an external connection terminal. Herein, since the terminals 36 and 38 are subjected to the same electrical potential, any one of the terminals 36 and 38 may be used as the external connection terminal. Alternatively, a portion of the bus bar 50 may be used as the external connection terminal.

Concave portions 30x and 30y are arranged on one surface of the capacitor 30. Concave portions 30x and 30y are holes that have almost rectangular shapes in plan view, and are disposed in areas that overlap with the bus bars 40 and 50, respectively. The concave portions 30x and 30y constitute portions of heat sinks 65 and 66, respectively. The heat sinks 65 and 66 will be described later.

A cooling fin 41 is formed on one side of the bus bar 40 which opposes the capacitor 30. Further, an insulating film 42 is formed on the cooling fin 41 and the bus bar 40 so that the insulating film 42 covers the surface of the cooling fin 41 and a portion of the surface of the bus bar 40. The bus bar 40 and the cooling fin 41 may be formed uniformly or connected with each other. The bus bar 40 and the cooling fin 41 may be made of metal having high heat conductivity such as copper (Cu), aluminum (Al) or the like, for example. The insulating film 42 may be made of polyamide or the like, for example. Herein, a cross-sectional shape of the cooling fin 41 is not limited to a rectangular wave shape. The cross-sectional shape of the cooling fin 41 may be a sine wave shape, a triangular wave shape or the like, for example.

The semiconductor element 44 is mounted onto the other side of the bus bar 40 which does not oppose to the capacitor 30 via a connection part 43. Solder, conductive adhesive or the like may be used as the connection part 43, for example. The main component of the semiconductor element 44 is silicon (Si), silicon carbide (SiC) or the like, for example. The semiconductor element 44 can perform as an insulated gate bipolar transistor (IGBT), a diode, a metal oxide semiconductor field effect transistor (MOSFET) or the like, for example. An exemplary concrete circuit configuration of the semiconductor element 44 will be described later.

The bus bar 40 opposes the capacitor 30 and is fixed to the capacitor 30 via a seal member 61 by the fixing members 63 in a state where the cooling fin 41 coated by the insulating film 42 is disposed in the concave portion 30x. Since the bus bar 40 is fixed to the capacitor 30 in a state where the bus bar 40 contacts with the terminals 31 and 33, the bus bar 40 is electrically connected to the terminals 31 and 33.

The seal member 61 is a type of a member which has a function of suppressing leakage of a coolant. An O-ring made of ethylene-propylene-diene monomer (EPDM) resin or the like may be used as the seal member 61. Screws or the like may be used as the fixing members 63, for example. In a case where the screws are used as the fixing members 63, screw holes $31x$, $33x$, $35x$ and $37x$ may be formed into the terminals 31, 33, 35 and 37 in advance, respectively. Screw holes may be formed into portions of the bus bars 40 and 50 that correspond to the screw holes $31x$, $33x$, $35x$ and $37x$, respectively.

Solders, conductive adhesives or the like may be used as the fixing members 63, and the fixing members 63 may be disposed between the terminals 31 and 33. Since the screws can fix the bus bar 40 to the terminals 31 and 33 more tightly than the solders or the conductive adhesives, it is preferable to use the screws as the fixing members 63. By using the screws as the fixing members 63, it becomes possible to correct warping of the bus bar 40 effectively which is caused by the difference of coefficient of thermal expansion between the bus bar 40 and the semiconductor element 44. In this case, it is preferable to use harder material as the seal member 61 so that the semiconductor module 10 can be tolerant with the warping of the bus bar 40.

Herein, the coefficient of thermal expansion of the bus bar 40 is about 17 ppm/° C. in a case where the bus bar 40 is made of copper (Cu), and the coefficient of thermal expansion of the bus bar 40 is about 23 ppm/° C. in a case where the bus bar 40 is made of aluminum (Al). On the contrary, the coefficient of thermal expansion of the semiconductor element 44 is about 3 ppm/° C. in a case where the main component of the semiconductor element 44 is silicon (Si), and the coefficient of thermal expansion of the semiconductor element 44 is about 7 ppm/° C. in a case where the main component of the semiconductor element 44 is silicon carbide (SiC). The difference of the coefficient of thermal expansion may cause the warping of the bus bar 40 in a case where the semiconductor element 44 radiates heat, for example.

A space surrounded by the cooling fin 41 coated by the insulating film 42, a portion of the bus bar 40 coated with the insulating film 42, the concave portion $30x$, a peripheral portion of the concave portion $30x$, and the seal member 61 forms the heat sink 65. The heat sink 65 includes a flow channel surrounded by the cooling fin 41, the portion of the bus bar 40, the concave portion $30x$, the peripheral portion of the concave portion $30x$, and the seal member 61. The semiconductor element 44, the heat sink 65 and the capacitor 30 are stacked in this order. The semiconductor element 44 is disposed in an area which overlaps with the capacitor 30 as viewed from a stack direction (Y direction) of the semiconductor element 44, the heat sink 65 and the capacitor 30.

The heat sink 65 is in communication with an inlet 71 and an outlet 72 via a flow channel of the coolant (not illustrated). The coolant flows into the heat sink via the inlet 71 and flows out from the outlet 72. The coolant flows in an area which is a part of the area where the heat sink 65 is located and which overlaps with at least the semiconductor element 44 as viewed from the stack direction (Y direction). Herein, it is necessary for the insulating film 42 to coat a portion of the surface of the bus bar 40 and the surface of the cooling fin 41 so that the coolant in the heat sink 65 does not directly contact with the bus bar 40 and the cooling fin 41.

The bus bar 50 is arranged in parallel with the bus bar 40 and is spaced laterally with each other. A cooling fin 51 is formed on one side of the bus bar 50 which opposes the capacitor 30 similar to the cooling fin 41 and the bus bar 40. Further, an insulating film 52 is formed on the cooling fin 51 and the bus bar 50 so that the insulation film 52 covers the surface of the cooling fin 51 and a portion of the surface of the bus bar 50. The cooling fin corresponds to the cooling fin 41, and the insulating film corresponds to the insulating film 42. The semiconductor element 54 is mounted onto the other side of the bus bar 50 which does not oppose the capacitor 30 via a connection part 53. The connection part 53 corresponds to the connection part 43.

Descriptions of the similar portions of the bus bar 50, the cooling fin 51, the insulating film 52, the connection part 53 and the semiconductor element 54 to the portion of the bus bar 40, the cooling fin 41, the insulating film 42, the connection part 43 and the semiconductor element 44, respectively, are omitted.

The bus bar 50 opposes the capacitor 30 and is fixed to the capacitor 30 via a seal member 62 by the fixing members 64 in a state where the cooling fin 51 coated by the insulating film 52 is disposed in the concave portion 30y. Since the bus bar 50 is fixed to the capacitor 30 in a state where the bus bar 50 contacts with the terminals 35 and 37, the bus bar 50 is electrically connected to the terminals 35 and 37. Since the seal member 62 and the fixing members 64 are similar to the seal member 61 and the fixing members 63, the descriptions thereof are omitted.

A space surrounded by the cooling fin 51 coated by the insulating film 52, a portion of the bus bar 50 coated with the insulating film 52, the concave portion 30y, a peripheral portion of the concave portion 30y, and the seal member 62 forms the heat sink 66. The heat sink 66 includes a flow channel surrounded by the cooling fin 51, the portion of the bus bar 50, the concave portion 30y, the peripheral portion of the concave portion 30y, and the seal member 62. The semiconductor element 54, the heat sink 66 and the capacitor 30 are stacked in this order. The semiconductor element 54 is disposed in an area which overlaps with the capacitor 30 as viewed from a stack direction (Y direction) of the semiconductor element 54, the heat sink 66 and the capacitor 30.

The heat sink 66 is in communication with the inlet 71 and the outlet 72 similar to the heat sink 65. The coolant flows in an area which overlaps with at least the semiconductor element 44 in the heat sink 66 as viewed from the stack direction (Y direction). Herein, it is necessary for the insulating film 52 to coat a portion of the surface of the bus bar 50 and the surface of the cooling fin 51 so that the coolant in the heat sink 66 does not directly contact with the bus bar 50 and the cooling fin 51.

Figure 5:
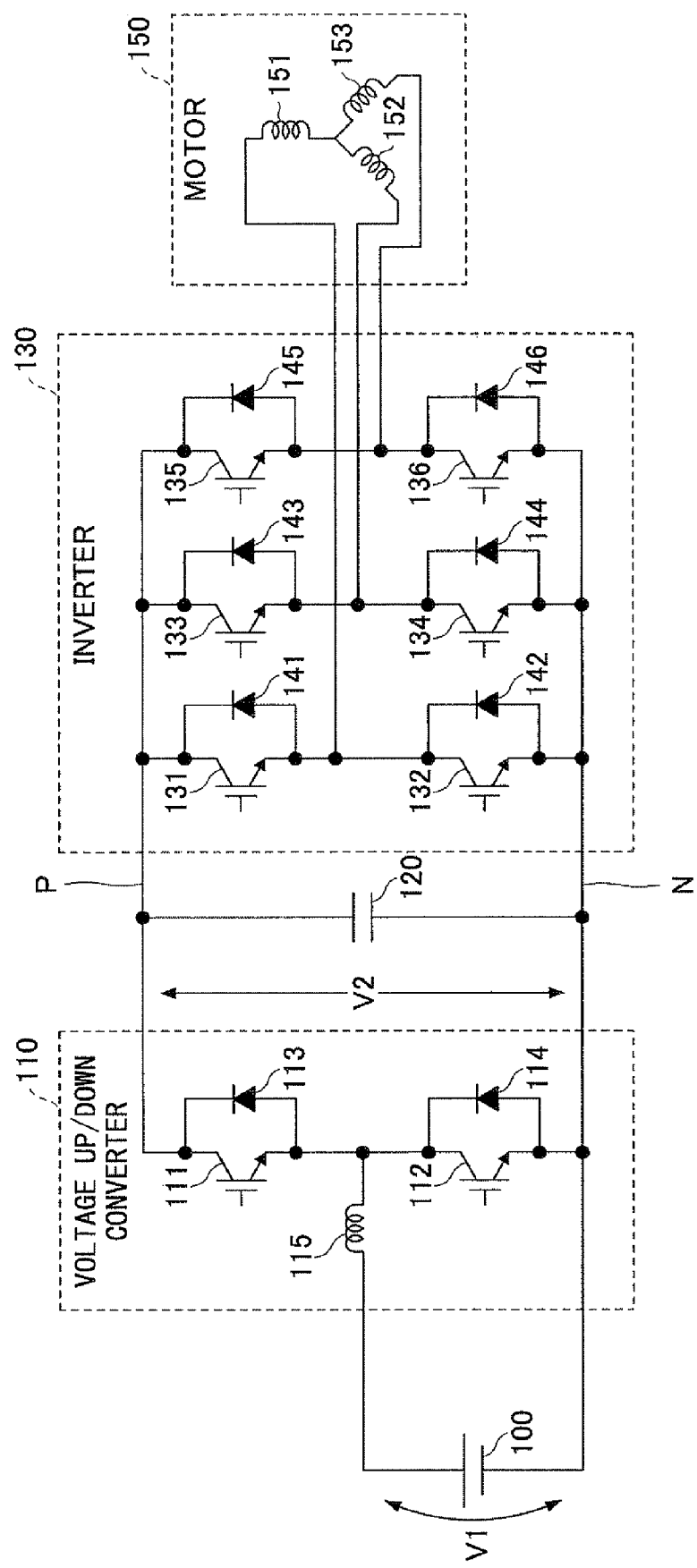
FIG. 5 is a diagram illustrating an exemplary circuit of a system including the semiconductor module according to the first embodiment.

In the followings, a system including the semiconductor module 10 will be described. FIG. 5 is a diagram illustrating an exemplary circuit of the system including the semiconductor module according to the first embodiment. The system as illustrated in FIG. 5 includes a battery 100, a voltage up/down converter 110, a capacitor 120, an inverter 130 and the motor 150. Herein, the system may include another inverter and/or another motor driven by another inverter.

The battery 100 is a type of an electric storage device which may be a secondary battery such as a nickel hydride battery or lithium ion battery, an electric double layer capacitor or the like.

The voltage up/down converter 110 includes switching elements 111 and 112, diodes 113 and 114 and a reactor 115. In FIG. 5, the switching elements 111 and 112 are the insulated gate bipolar transistors (IGBT). The IGBT is a type of a bipolar transistor which incorporates a MOSFET into a gate and includes three terminals of an emitter, a collector and a gate. The diodes 113 and 114 are flywheel diodes. The flywheel diode is a type of a diode which is used when a current flows back.

The switching elements 111 and 112 are connected in series. The switching element 111 and the diode 113 are connected in parallel, and the switching element 112 and the diode 114 are connected in parallel. The gates of the switching elements 111 and 112 are connected to an electronic control unit (ECU) which is not illustrated. The switching elements 111 and 112 perform switching operation based on drive signals that are output from the ECU.

The emitter of the switching element 111, an anode of the diode 113, the collector of the switching element 112, a cathode of the diode 114 and one end of the reactor 115 are connected with each other. The other end of the reactor 115 is connected to the positive terminal of the battery 100.

The collector of the switching element 111 and a cathode of the diode 113 are connected to one end of the capacitor 120 and one end (a P terminal) of the inverter 130. The emitter of the switching element 112 and an anode of the diode 114 are connected to the negative terminal of the battery 100, the other end of the capacitor 120 and the other end (an N terminal) of the inverter 130. Accordingly, the capacitor 120 is connected in parallel to the voltage up/down converter 110. The capacitor 120 smoothes direct voltage output from the battery 110 and supplies the smoothed voltage to the inverter 130.

The inverter 130 includes switching elements 131 to 136 and diodes 141 to 146. The switching elements 131 to 136 are IGBTs. The diodes 141 to 146 are flywheel diodes. The switching elements 131 and 132, the switching elements 133 and 134, and the switching elements 135 and 136 are connected in series, respectively. The switching elements 131 to 136 and the diodes 141 to 146 are connected in parallel, respectively. The gates of the switching elements 131 to 136 are connected to the ECU (not illustrated) and perform switching operation based on drive signals that are output from the ECU.

A collector of the switching element 131, a cathode of the diode 141, a collector of the switching element 133, a cathode of the diode 143, a collector of the switching element 135 and a cathode of the diode 145 are connected with each other at the P terminal. An emitter of the switching element 132, an anode of the diode 142, an emitter of the switching element 134, an anode of the diode 144, an emitter of the switching element 136 and an anode of the diode 146 are connected with each other at the N terminal.

The emitter of the switching element 131, the anode of the diode 141, the collector of the switching element 132, and the cathode of the diode 142 are connected to one end of a coil 151. The emitter of the switching element 133, the anode of the diode 143, the collector of the switching element 134, and the cathode of the diode 144 are connected to one end of a coil 152. The emitter of the switching element 135, the anode of the diode 145, the collector of the switching element 136, and the cathode of the diode 146 are connected to one end of a coil 153. The other ends of the coils 151, 152 and 153 of the motor 150 are connected with each other.

The motor 150 is a type of an electric motor which generates torque used for driving drive wheels of a vehicle such as a hybrid vehicle, an electric vehicle, a fuel cell vehicle of the like that generates drive force from electric energy. The other ends of the coils 151, 152 and 153 that constitute a u-phase, a v-phase and a w-phase, respectively, are connected to a neutral point. The motor 150 may be configured to have a function of an electric motor and a function of a generator.

The system as illustrated in FIG. 5 operates as follows. The voltage up/down converter 110 performs a switching operation in accordance with a switching control signal output from the ECU (not illustrated). The voltage up/down converter 110 boosts up a voltage V1 between the positive terminals and the negative terminals of the battery 100 to a voltage V2 and outputs the voltage V2 between both of the terminals of the capacitor 120. More specifically, in the voltage up/down converter 110, current flows from the battery 100 to the reactor 115 and the reactor 115 accumulates an electric energy temporarily when the switching element 111 is turned off and the switching element 112 is turned on. When the switching element 111 is turned on and the switching element 112 is turned off, the electric energy accumulated in the reactor 115 is output from the reactor 115 via the diode 113. Accordingly, the voltage V1 between both of the terminals of the battery 100 is boosted up to the voltage V2 and output to the capacitor 120.

The voltage up/down converter 110 performs the switching operation in accordance with the switching control signal output from the ECU (not illustrated). The voltage up/down converter 110 steps down the voltage V2 between both of the terminals of the capacitor 120 to the voltage V1 and outputs the voltage V2 to the battery 100. More specifically, in the voltage up/down converter 110, current flows from the capacitor 120 to the reactor 115, and the reactor 115 accumulate an electric energy temporarily when the switching element 111 is turned on and the switching element 112 is turned off. When the switching element 111 is turned off and the switching element 112 is turned on, the electric energy accumulated in the reactor 115 causes current to flow back via the diode 114. Accordingly, the voltage V2 between both of the terminals of the capacitor 120 is stepped down to the voltage V1, and then the battery 100 is charged.

The capacitor 120 smoothes the direct voltage output from the voltage up/down converter 110 and supplies the smoothed voltage to the inverter 130. The inverter 130 is a type of a switching circuit which converts the alternating voltage and the direct voltage mutually. When the direct voltage is supplied from the capacitor 120 to the inverter 130, the inverter 130 performs the switching operation in accordance with the switching control signal. The inverter 130 converts the direct voltage to the alternating voltage, and drives the motor 150.

When a regenerative braking of the vehicle is applied, the inverter 130 performs the switching operation in accordance with the switching control signal output from the ECU (not illustrated), and converts the alternating voltage generated by the motor 150 to the direct voltage. The inverter 130 supplies the direct voltage to the voltage up/down converter 110 via the capacitor 120. Herein the regenerative braking includes a braking which is caused by a brake operation of a driver of the vehicle and performs regeneration, and a deceleration or discontinuation of acceleration of the vehicle that is caused when an accelerator pedal is released.

The semiconductor element 44 of the semiconductor module 10 according to the first embodiment may have a configuration including the switching element 111 and the diode 113 as illustrated in FIG. 5, for example. The semiconductor element 54 of the semiconductor module 10 according to the first embodiment may have a configuration including the switching element 112 and the diode 114 as illustrated in FIG. 5, for example.

In this case, at least one of the terminals 32 and 34 may be electrically connected to the P terminal of the inverter 130 as illustrated in FIG. 5. Connection terminals that correspond to the collector of the switching element 111 and the cathode of the diode 113 may be disposed on the surface of the semiconductor element 44 which faces the connection part 43 and may be electrically connected to the bus bar 40 via the connection part 43. In this case, at least one of the terminals 32 and 34, the terminals 31 and 33, one of the electrodes of the capacitor 30, the bus bar 40 and the connection terminals disposed on the surface of the semiconductor element 44 which faces the connection part 43 are electrically connected to the P terminal as illustrated in FIG. 5, respectively. External connection terminals that correspond to the emitter of the switching element 111 and the anode of the diode 113 as illustrated in FIG. 5 may be disposed onto the surface of the semiconductor element 44 opposite to the connection part 43. The external connection terminals become portions that are connected to one end of the reactor 115 as illustrated in FIG. 5.

In this case, at least one of the terminals 36 and 38 may be electrically connected to the N terminal of the inverter 130 as illustrated in FIG. 5. Connection terminals that correspond to the emitter of the switching element 112 and the anode of the diode 114 may be disposed on the surface of the semiconductor element 54 which faces the connection part 53 and may be electrically connected to the bus bar 50 via the connection part 53. In this case, at least one of the terminals 36 and 38, the terminals 35 and 37, the other electrode of the capacitor 30, the bus bar 50 and the connection terminals disposed on the surface of the semiconductor element 54 which faces the connection part 53 are electrically connected to the N terminal as illustrated in FIG. 5, respectively. External connection terminals that correspond to the collector of the switching element 112 and the cathode of the diode 113 as illustrated in FIG. 5 may be disposed onto the surface of the semiconductor element 54 opposite to the connection part 53. The external connection terminals become portions that are connected to one end of the reactor 115 as illustrated in FIG. 5.

As described above, the semiconductor elements 44 and 54 can realize the function of a portion of the voltage up/down converter 110 except for the reactor 115 as illustrated in FIG. 5. The capacitor 30 can realize the function of the capacitor 120 as illustrated in FIG. 5.

However, the switching element 111 and the diode 113 may be divided into separate packages, and mounted onto positions of the semiconductor element 44 separately, for example. The switching element 112 and the diode 114 may be divided into separate packages, and mounted onto positions of the semiconductor element 54 separately, for example.

Herein, in the semiconductor module 10, one or more additional bus bar(s) may be arranged in parallel with the bus bars 40 and 50, and the inverter 130 may be realized by semiconductor elements that are mounted on the bus bars 40, 50 and the additional bus bar(s). Alternatively, the semiconductor elements included in the semiconductor module 10 may constitute a part of the circuits of the voltage up/down converter 110 and the inverter 130.

In the followings, advantageous effects of the semiconductor module 10 according to the first embodiment will be described by comparing the semiconductor module 10 with a semiconductor module of a comparative example.

Figure 6:
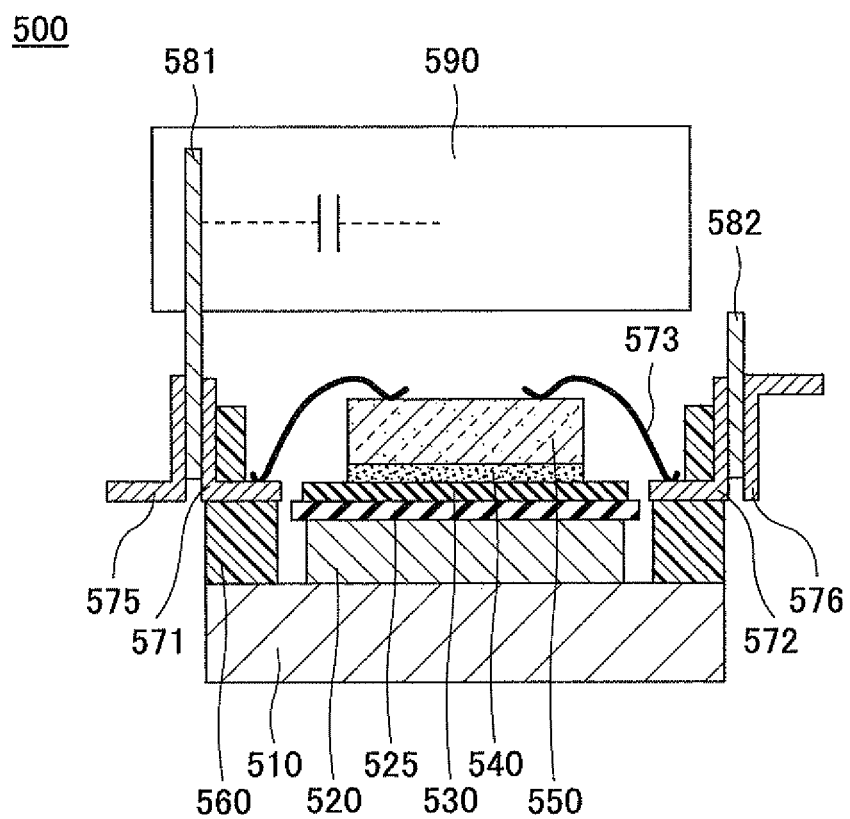
FIG. 6 is a cross-sectional view of a semiconductor module of a comparative example.

FIG. 6 is a cross-sectional view of the semiconductor module 500 of the comparative example. As illustrated in FIG. 6, in the semiconductor module 500, a radiator plate 520 and a housing 560 is mounted on a heat sink 510. The radiator plate 520 is made of metal or the like, and the housing 560 is made of resin or the like. An insulator 525 and a substrate 530 which is made of ceramic or the like are stacked on the radiator plate 520. A semiconductor element 550 is mounted on the substrate 530 via a connection part 540 which is constituted of solder or the like.

Terminals 571 and 572 that are made of metal or the like are arranged on the housing 560. The terminals 571 and 572 are connected to the semiconductor element 550 via bonding members 573. The bonding members may be metal wires or the like. A bus bar 581 is pinched and held between the terminal 571 and a terminal 575, and is electrically connected with the terminals 571 and 575. A bus bar 582 is pinched and held between the terminal 572 and a terminal 576, and is electrically connected with the terminals 572 and 576. The terminals 575 and 576 constitute external connection terminals.

A capacitor 590 is connected to one side of the bus bar 581. In FIG. 6, although an area in which the capacitor 590 is located is illustrated, the capacitor 590 may be a film capacitor or an electrolytic capacitor which is sealed by molded resin or the like, for example.

As described above, in the semiconductor module 500, the heat sink 510 and the capacitor 590 are not unified but are separated. The heat sink 510 and the capacitor 590 are disposed on each side of the semiconductor element 550, respectively, and are not connected with each other. Therefore, heat generated by the semiconductor element 550 is conducted to the capacitor 590, and the capacitor 590 generates heat. Thus, it is necessary to operate the semiconductor element 550 at a temperature less than the upper temperature limit of the capacitor 590 (generally 100° C.) in order to suppress breakage of the capacitor 590. Accordingly, it is difficult to operate the semiconductor element 550 of which the main component is silicon carbide (SiC) at a high temperature such as 200° C., for example.

Further, since it is necessary to suppress heat generation of the capacitor 590, it is difficult to dispose the capacitor 590 close to the semiconductor element 550. Accordingly, the length of a line between the capacitor 590 and the semiconductor element 550 becomes longer, and inductance of the line becomes greater. Thus, it becomes difficult to operate the semiconductor element 550 at high speed.

On the contrary, according to the semiconductor module 10 of the first embodiment, the semiconductor element 44 and the capacitor 30 which is electrically connected to the semiconductor element 44 are stacked with each other via the heat sink 65. The semiconductor 44 is disposed in an area which overlaps with the capacitor 30 as viewed from the stack direction (Y direction). The coolant flows in an area which is a part of the area where the heat sink 65 is located and which overlaps with at least the semiconductor element 44 as viewed from the stack direction (Y direction). In the semiconductor module 10 as described above, since the cooling fin 41 coated by the insulating film 42 is dipped into the coolant which flows in the heat sink 65, the heat generated from the semiconductor element 44 is conducted to the coolant via the cooling fin 41. Then the heat is carried out from the semiconductor module 10 and is radiated.

Similarly, the semiconductor element 54 and the capacitor 30 which is electrically connected to the semiconductor element 54 are stacked via the heat sink 66. The semiconductor element 54 is disposed in an area which overlaps with the capacitor 30 as viewed from a stack direction (Y direction). The coolant flows in an area which is a part of the area where the heat sink 66 is located and which overlaps with at least the semiconductor element 54 as viewed from the stack direction (Y direction). In the semiconductor module 10 as described above, since the cooling fin 51 coated by the insulating film 52 is dipped into the coolant which flows in the heat sink 66, the heat generated from the semiconductor element 54 is conducted to the coolant via the cooling fin 51 in a similar manner to the cooling fin 41, the insulating film 42, the semiconductor 44 and the heat sink 65. Then the heat is carried out from the semiconductor module 10 and is radiated. Thus, the heat generated by the semiconductor elements 44 and 54 is conducted to and carried out by the heat sinks 65 and 66, and is not conducted to the capacitor 30. According to the semiconductor module 10, it becomes possible to operate the semiconductor elements 44 and 54 at higher temperature than the semiconductor module of the comparative example. For example, even in a case where the upper temperature limit of the capacitor 30 is 100° C., it becomes possible to operate the semiconductor elements 44 and 54 that are mainly made of silicon carbide (SiC) at high temperature such as about 200° C., if the capacitor 30 is cooled by the heat sinks 65 and 66 and the temperature of the capacitor 30 is kept under 100° C.

In a case where the capacitor 30 generates heat, the capacitor 30 is cooled by the heat sinks 65 and 66.

Since the capacitor 30 is disposed close to the semiconductor elements 44 and 54, it becomes possible to reduce the inductance of the line between the capacitor 30 and semiconductor element 44 and the line between the capacitor 30 and the semiconductor element 54. Accordingly, switching loss and/or surge voltage is reduced, and it becomes possible to perform high speed switching of the semiconductor elements 44 and 54.

Since it is possible to perform the high speed switching of the semiconductor elements 44 and 54, it becomes possible to reduce the capacitance of the capacitor 30 and to reduce the size and manufacturing cost of the semiconductor module 10.

Since it is possible to use the cooling fin 41 which is large enough for the size of the semiconductor element 44, it becomes possible to improve radiation efficiency of the semiconductor element 44. The same applies to the semiconductor 54. Thus, elements that have different operating temperature ranges such as the semiconductor elements 44 and 54 and the capacitor 30, for example, can exist together.

First Variation of First Embodiment

In the first variation of the first embodiment, the relation of the connection of the electrodes and the terminals of the capacitor 30 are changed. Herein, the same elements as or elements similar to those of the semiconductor module 10 of the first embodiment are referred to by the same reference numerals, and a description thereof is omitted.

Figure 7:
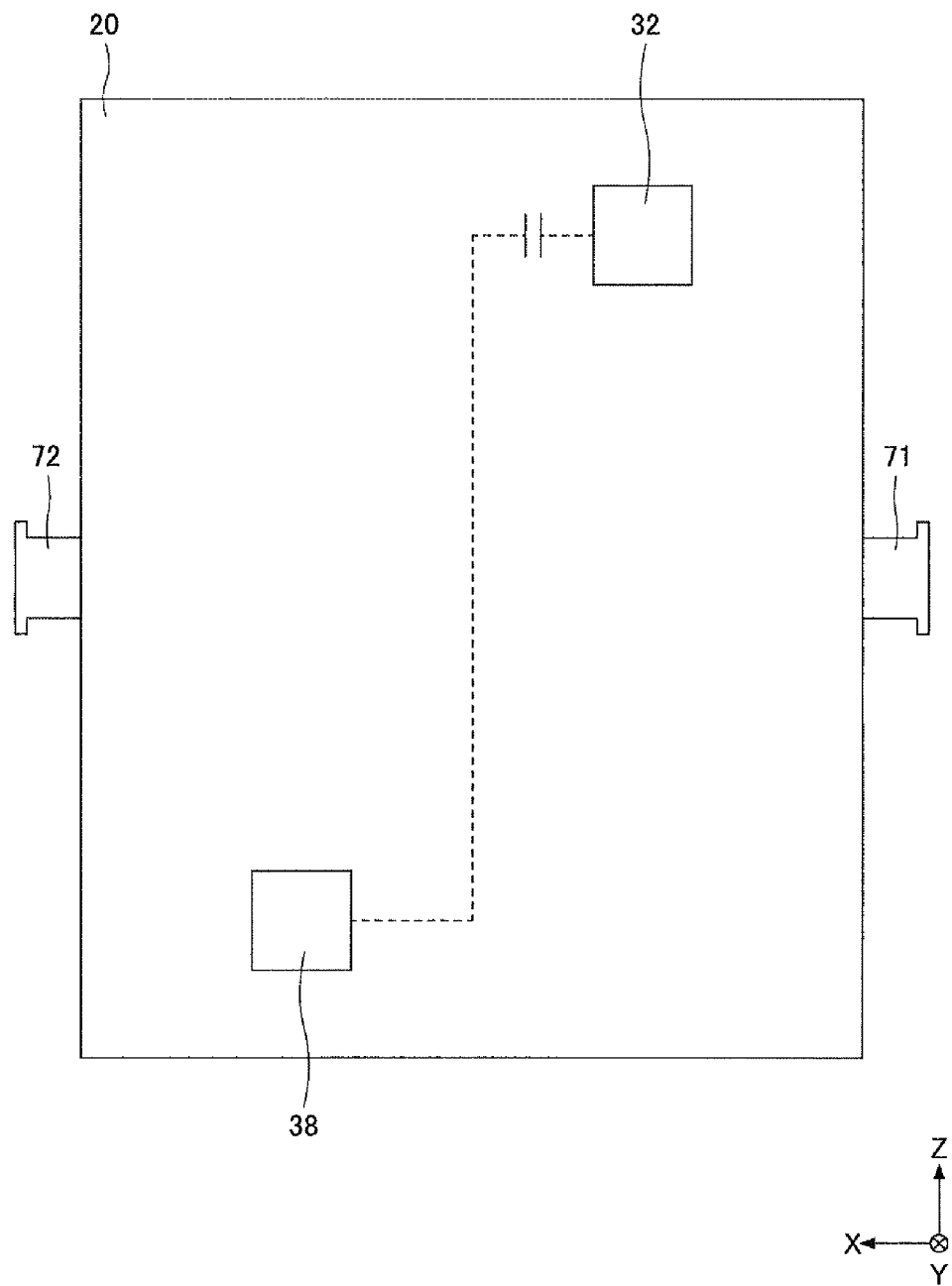
FIG. 7 is a back view illustrating an example of a semiconductor module according to a first variation of the first embodiment.
Figure 8:
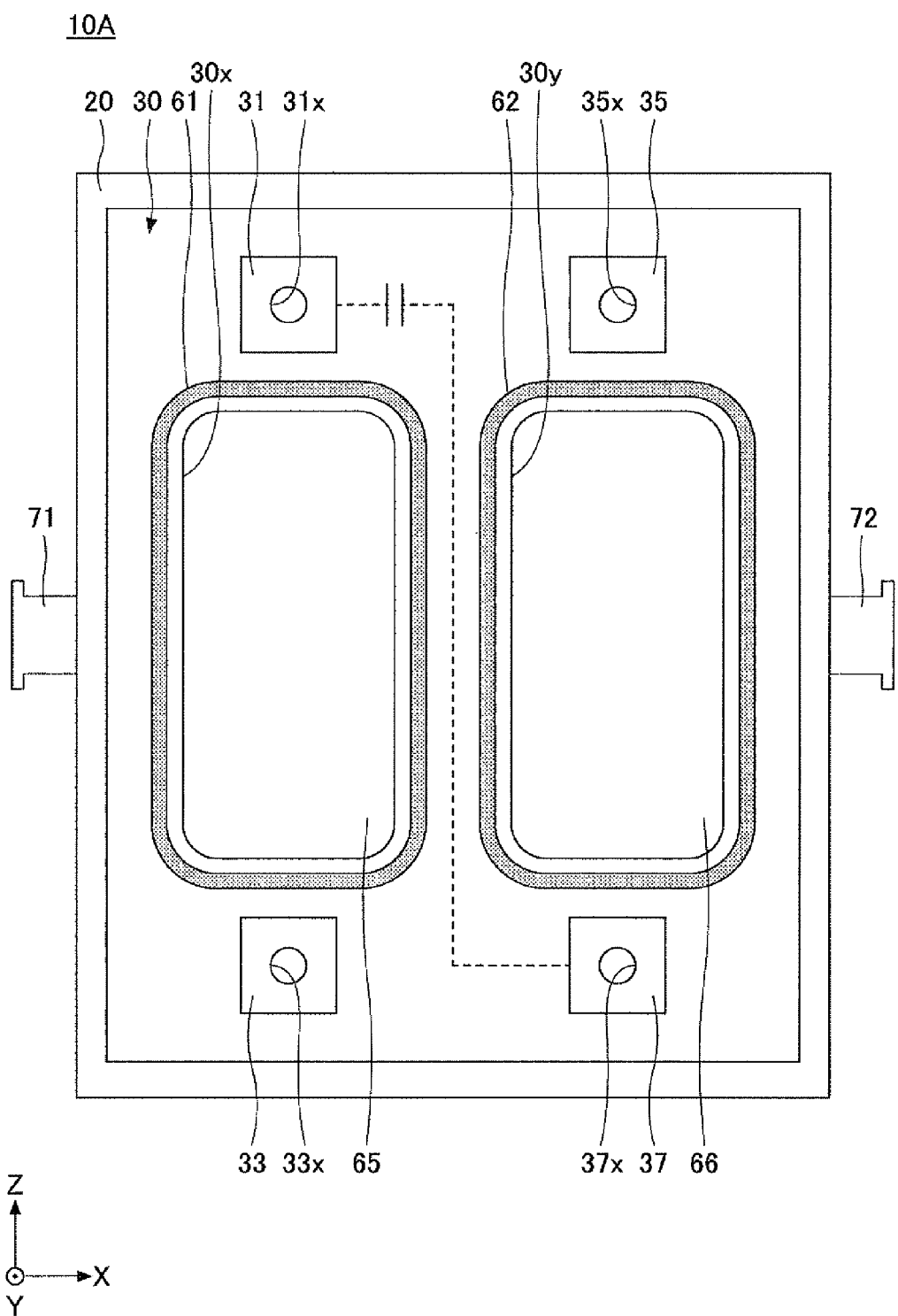
FIG. 8 is a front view illustrating an example of a portion of the semiconductor module according to the first variation of the first embodiment.
Figure 9:
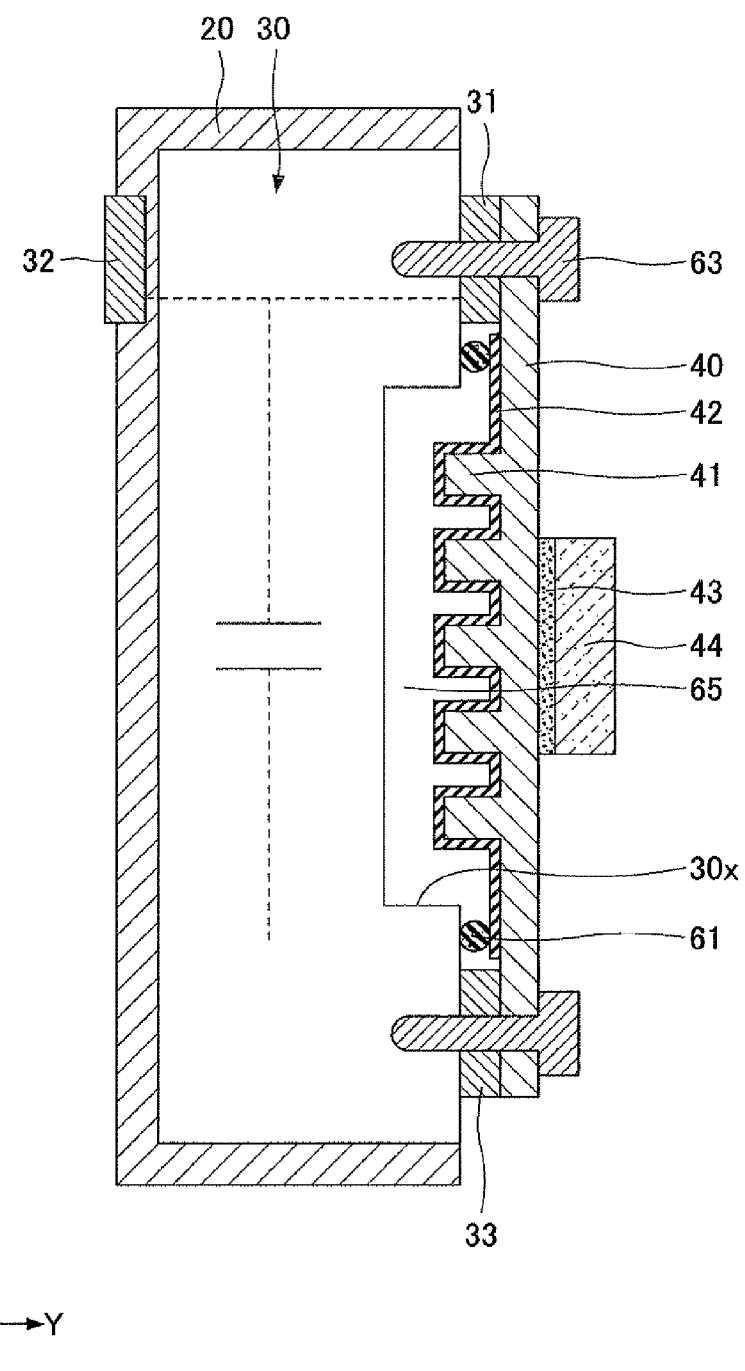
FIG. 9 is a cross-sectional view of the semiconductor module according to the first variation of the first embodiment.

Since the front view of a semiconductor module 10A of the first variation of the first embodiment is similar to that of the semiconductor module 10, a figure of the front view of the semiconductor module 10A is omitted. FIG. 7 is a back view illustrating an example of the semiconductor module 10A according to the first variation of the first embodiment. FIG. 8 is a front view illustrating an example of a portion of the semiconductor module 10A according to the first variation of the first embodiment. FIG. 9 is a cross-sectional view of the semiconductor module 10A. The cross section as illustrated in FIG. 9 corresponds to the cross section as illustrated in FIG. 4.

As illustrated in FIGS. 7 to 9, the relation of the connection of the electrodes and the terminals of the capacitor 30 of the semiconductor module 10A is different from that of the semiconductor module 10 (see FIG. 2). In the semiconductor module 10 (see FIG. 2), the terminals 31 and 33 are electrically connected to one electrode (not illustrated) of the capacitor 30, and the terminals 35 and 37 are electrically connected to the other electrode (not illustrated) of the capacitor 30. On the contrary, in the semiconductor module 10A, the terminal 31 is electrically connected to one electrode (not illustrated) of the capacitor 30, and the terminal 37 is electrically connected to the other electrode (not illustrated) of the capacitor 30.

The terminals 33 and 35 are disposed only for purpose of fixing the bus bars 40 and 50 to the capacitor 30, respectively. Thus, in the semiconductor module 10A, the terminal 34 (see FIG. 2), which is disposed in an almost opposed area to the area in which the terminal 33 is disposed with regard to the capacitor 30, is not disposed. In the semiconductor module 10A, the terminal 36 (see FIG. 2), which is disposed in an almost opposed area to the area in which the terminal 35 is disposed with regard to the capacitor 30, is not disposed.

The terminals 31 and 32 are electrically connected. The terminal 32 may be used as an external connection terminal. Alternatively, a portion of the bus bar 40 may be used as the external connection terminal. The terminals 37 and 38 are electrically connected. The terminal 38 may be used as an external connection terminal. Alternatively, a portion of the bus bar 50 may be used as the external connection terminal.

As described above, the relation of the connection of electrodes and the terminals of the capacitor 30 may be arranged, and the external connection terminal may be chosen from the terminals of the capacitor 30. The semiconductor module 10A of the first variation of the first embodiment has a similar advantageous effect to that of the semiconductor module 10.

Second Variation of First Embodiment

In the second variation of the first embodiment, the bus bars and the cooling fins are separated and connected by an insulating sheet. Herein, the same elements as or elements similar to those of the semiconductor module 10 of the first embodiment are referred to by the same reference numerals, and a description thereof is omitted.

Figure 10:
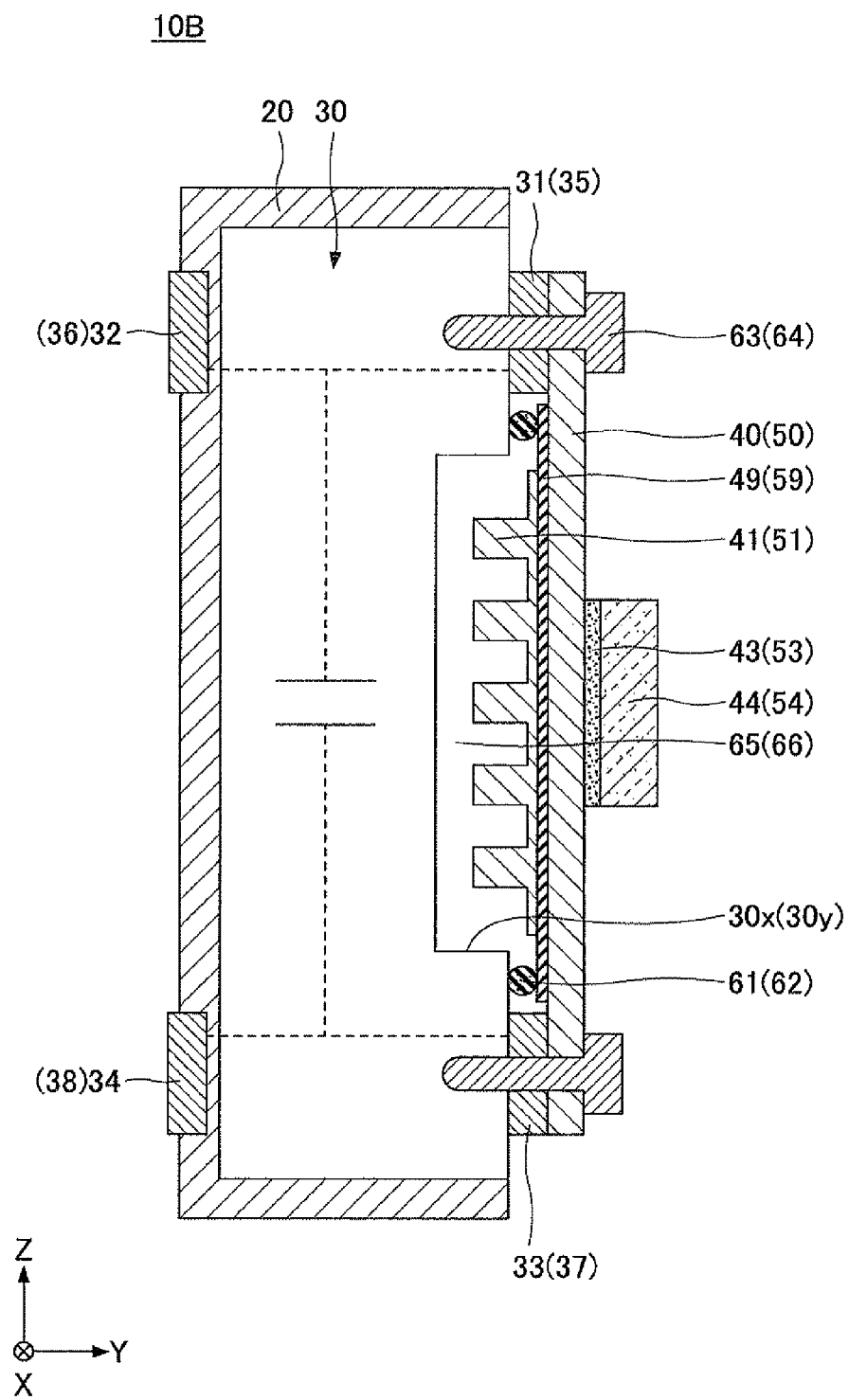
FIG. 10 is a cross-sectional view of a semiconductor module of a second variation of the first embodiment.

FIG. 10 is a cross-sectional view of the semiconductor module of the second variation of the first embodiment. The cross section as illustrated in FIG. 10 corresponds to the cross section as illustrated in FIG. 4. Reference numerals in parentheses in FIG. 10 indicate configuration in a cross section corresponding to the cross section along line A2-A2 as illustrated in FIG. 4. Since the front view and the back view of the semiconductor module of the second variation of the first embodiment are the same as those of the semiconductor module 10 of the first embodiment, figures corresponding to FIGS. 1 to 3 are omitted.

As illustrated in FIG. 10, the bus bar 40 and the cooling fin 41 are separated and connected by an insulating sheet 49 which has an adhesion. Similarly, the bus bar 50 is separated from the cooling fin which corresponds to the cooling fin 41, and is connected with the cooling fin by an insulating sheet having an adhesion. Since it is necessary to insulate the coolant and the bus bars 40 and 50, areas in that the insulating sheets 49 and 59 are disposed are extended so that the insulating sheets 49 and 59 contact with the seal members 61 and 62.

The insulating film or the insulating sheet may be disposed to an arbitrary position as long as the coolant and the bus bars 40 and 50 are insulated with each other. The semiconductor module of the second variation of the first embodiment has a similar advantageous effect to that of the semiconductor module 10. In addition to this, the semiconductor module of the second variation of the first embodiment has an advantageous effect as follows. Since the cooling fins 41 and 51 contact with the coolant directly, it becomes possible to further improve the cooling performance compared with the first embodiment.

Second Embodiment

In the second embodiment, a reactor 90 is disposed onto the bus bars 40 and 50. Hereinafter, the same elements as or elements similar to those of the semiconductor module 10 of the first embodiment are referred to by the same reference numerals, and a description thereof is omitted.

Figure 11:
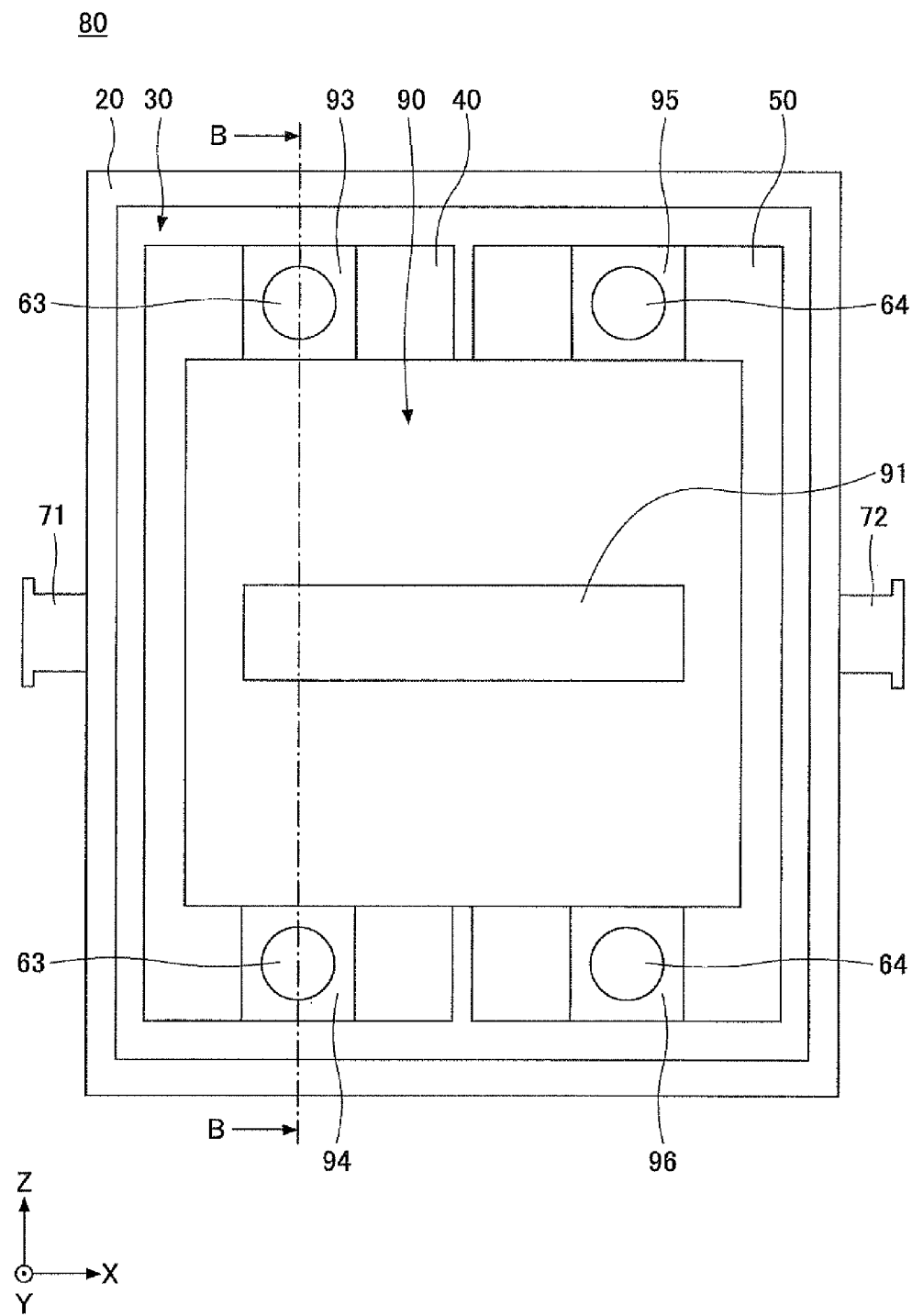
FIG. 11 is a front view illustrating an example of a semiconductor module according to a second embodiment.
Figure 12:
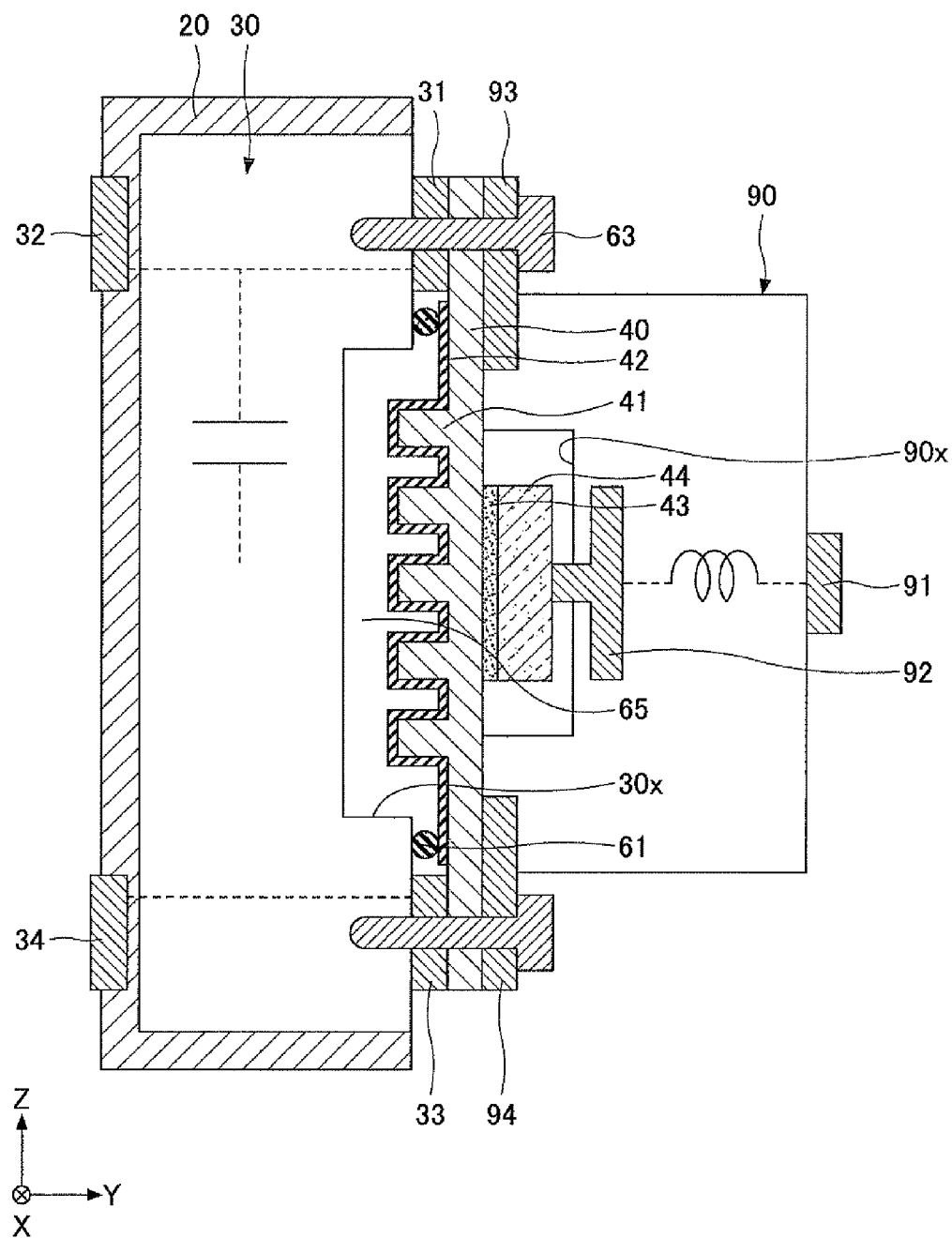
FIG. 12 is a cross-sectional view of the circuit board taken along a line B-B illustrated in FIG. 11.

FIG. 11 is a front view illustrating an example of a semiconductor module 80 according to the second embodiment. FIG. 12 is a cross-sectional view of the circuit board taken along a line B-B illustrated in FIG. 11. Since the portion of the front view and the back view of the semiconductor module 80 of the second embodiment are the same as those of the semiconductor module 10 of the first embodiment as illustrated in FIGS. 2 and 3, figures corresponding to FIGS. 1 to 3 are omitted.

As illustrated in FIGS. 11 and 12, the semiconductor module 80 includes the reactor 90 which is disposed on the semiconductor elements 44 and 54 that are stacked on the bus bars 40 and 50. A portion of the reactor 90 contacts with the cooling fins 41 and 51 via the bus bars 40 and 50. Although the reactor 90 is illustrated in a simplified manner in FIG. 12, the reactor 90 may be constituted of a coil element which is molded by a mold resin, for example.

The reactor 90 includes terminals 91 and 92 and terminals 93 to 96 that are made of copper (Cu), aluminum (Al) or the like. However, the terminals 93 to 96 may be made of insulating materials, for example. The terminal 91 is electrically connected to one end of the coil element of the reactor 90, and can be used as an external connection terminal. The terminal 92 is electrically connected to the other end of the coil element of the reactor 90.

The terminal 92 is electrically connected to a connection terminal (not illustrated) of the semiconductor element 44 that is disposed on an opposed surface with regard to the surface to which the connection part 43 is connected. The terminal 92 is electrically connected to a connection terminal (not illustrated) of the semiconductor element 54 that is disposed on an opposed surface with regard to the surface to which the connection part 53 is connected. The terminals 93 to 96 are the type of terminals that are used for fixing the reactor 90 onto the bus bars 40 and 50, and are electrically insulated from the coil element of the reactor 90.

A concave portion 90x is formed in the reactor 90. The reactor 90 is mounted onto the bus bars 40 and 50 in a state where the semiconductor elements 44 and 54 are disposed in the concave portion 90x. The terminals 93 and 94 are disposed in positions corresponding to the terminals 31 and 33, respectively, and are fixed to the capacitor 30 and the bus bar 40 by the fixing members 63. The terminals 95 and 96 are disposed in positions corresponding to the terminals 35 and 37, respectively, and are fixed to the capacitor 30 and the bus bar 50 by the fixing members 64.

The semiconductor element 44 of the semiconductor module 80 according to the second embodiment may have a configuration including the switching element 111 and the diode 113 as illustrated in FIG. 5, for example. The semiconductor element 54 of the semiconductor module 80 according to the second embodiment may have a configuration including the switching element 112 and the diode 114 as illustrated in FIG. 5, for example.

In this case, at least one of the terminals 32 and 34 may be electrically connected to the P terminal of the inverter 130 as illustrated in FIG. 5. Connection terminals that correspond to the collector of the switching element 111 and the cathode of the diode 113 may be disposed on the surface of the semiconductor element 44 which faces the connection part 43 and may be electrically connected to the bus bar 40 via the connection part 43. In this case, at least one of the terminals 32 and 34, the terminals 31 and 33, one of the electrodes of the capacitor 30, the bus bar 40 and the connection terminals disposed on the surface of the semiconductor element 44 which faces the connection part 43 are electrically connected to the P terminal as illustrated in FIG. 5, respectively. Connection terminals that correspond to the emitter of the switching element 111 and the anode of the diode 113 as illustrated in FIG. 5 may be disposed on the surface of the semiconductor element 44 opposite to the connection part 43, and may be electrically connected to the terminal 92.

In this case, at least one of the terminals 36 and 38 may be electrically connected to the N terminal of the inverter 130 as illustrated in FIG. 5. Connection terminals that correspond to the emitter of the switching element 112 and the anode of the diode 114 may be disposed on the surface of the semiconductor element 54 which faces the connection part 53 and may be electrically connected to the bus bar 50 via the connection part 53. In this case, at least one of the terminals 36 and 38, the terminals 35 and 37, the other electrode of the capacitor 30, the bus bar 50 and the connection terminals disposed on the surface of the semiconductor element 54 which faces the connection part 53 are electrically connected to the N terminal as illustrated in FIG. 5, respectively. Connection terminals that correspond to the emitter of the switching element 112 and the anode of the diode 113 as illustrated in FIG. 5 may be disposed onto the surface of the semiconductor element 54 opposite to the connection part 53, and may be electrically connected to the terminal 92. The terminal 91 may be electrically connected to the positive terminal of the battery 100 as illustrated in FIG. 5.

According to the configuration as described above, the semiconductor elements 44 and 54 and the reactor 90 can realize the function of the voltage up/down converter 110 as illustrated in FIG. 5. The capacitor 30 can realize the function of the capacitor 120 as illustrated in FIG. 5.

However, the switching element 111 and the diode 113 may be divided into separate packages, and mounted onto positions of the semiconductor element 44 separately, for example. The switching element 112 and the diode 114 may be divided into separate packages, and mounted onto positions of the semiconductor element 54 separately, for example.

The semiconductor module 80 according to the second embodiment has similar advantageous effects to those of the semiconductor module 10 according to the first embodiment. The semiconductor module 80 further has advantageous effects as follows. In the second embodiment, the capacitor 30, the semiconductor elements 44 and 54, and the reactor 90 are unified (stacked). The fixing members 63 are used for fixing the reactor 90 onto the bus bars 40 and 50, and for fixing bus bars 40 and 50 to the capacitor 30 at the same time. Thus, it becomes possible to reduce the size of the semiconductor module 80 compared with a configuration in that the reactor 90 is not disposed (stacked) on the bus bars 40 and 50 and is fixed to the side portions or bottom portion of the semiconductor module 80, for example. Further, it becomes possible to reduce the manufacturing cost of the semiconductor module 80.

Since the reactor 90 contacts with the cooling fins 41 and 51 via the bus bars 40 and 50, it becomes possible to cool the reactor 90.

Further, the present invention is not limited to these embodiments, but various variations and modifications may be made without departing from the scope of the present invention.

For example, the mounting direction of the semiconductor modules 10, 10A and 80 are not limited to a mounting direction in which Z direction as illustrated in FIG. 4 is aligned along the direction of gravitational force. Y direction as illustrated in FIG. 4 may be aligned along the direction of gravitational force. The mounting direction of the semiconductor modules 10, 10A and 80 may be aligned to any direction.

The configurations of the first embodiment, the first variation of the first embodiment, the second variation of the first embodiment and the second embodiment may be combined.

The descriptions of the semiconductor module of exemplary embodiments have been provided heretofore. The present invention is not limited to these embodiments, but various variations and modifications may be made without departing from the scope of the present invention.

The present application is based on Japanese Priority Application No. 2011-148040 filed on Jul. 4, 2011 with the Japanese Patent Office, the entire contents of which are hereby incorporated herein by reference.

What is claimed is:

1. A semiconductor module comprising:
a semiconductor element;
a capacitor configured to be electrically connected to the semiconductor element, the capacitor having concave portions;
at least one bus bar; and
a heat sink that is formed between the concave portions of the capacitor and the at least one bus bar,
wherein the semiconductor element and the capacitor are stacked with each other via the heat sink, and wherein the semiconductor element is disposed in a position overlapping with the capacitor as viewed from a stack direction.

2. The semiconductor module as claimed in claim 1, wherein a main component of the semiconductor element is silicon carbide.

3. The semiconductor module as claimed in claim 1, wherein the heat sink includes a flow channel of a coolant at least in an area overlapping with the semiconductor element as viewed from the stack direction.

4. The semiconductor module as claimed in claim 1, further comprising a reactor configured to be stacked with the semiconductor element.

5. The semiconductor module as claimed in claim 4, wherein the reactor contacts with the heat sink via a metal member on which the semiconductor element is mounted.

* * * * *